(12) United States Patent
Chung

(10) Patent No.: US 8,143,136 B2
(45) Date of Patent: Mar. 27, 2012

(54) METHOD FOR FABRICATING CROWN-SHAPED CAPACITOR

(75) Inventor: Chao-Hsi Chung, Hsinchu (TW)

(73) Assignee: Taiwan Memory Corporation, Hsin-Chu (TW)

( * ) Notice: Subject to any disclaimer, the term of this patent is extended or adjusted under 35 U.S.C. 154(b) by 0 days.

(21) Appl. No.: 12/979,775

(22) Filed: Dec. 28, 2010

(65) Prior Publication Data

US 2011/0159662 A1    Jun. 30, 2011

(30) Foreign Application Priority Data

Dec. 29, 2009   (TW) ................................ 98145470 A

(51) Int. Cl.
  *H01L 21/8242*  (2006.01)
  *H01L 29/41*    (2006.01)

(52) U.S. Cl. .. 438/396; 438/239; 438/253; 257/E21.014

(58) Field of Classification Search ................... 438/239, 438/253, 396; 257/E21.014
See application file for complete search history.

(56) References Cited

U.S. PATENT DOCUMENTS

| | | | | |
|---|---|---|---|---|
| 5,185,282 A | * | 2/1993 | Lee et al. | 438/253 |
| 5,399,518 A | * | 3/1995 | Sim et al. | 438/396 |
| 5,837,577 A | * | 11/1998 | Cherng | 438/253 |
| 6,232,168 B1 | * | 5/2001 | Coursey | 438/241 |

* cited by examiner

*Primary Examiner* — Thao Le
*Assistant Examiner* — Tanika Warrior
(74) *Attorney, Agent, or Firm* — Brich, Stewart, Kolasch & Birch, LLP

(57) ABSTRACT

A method for fabricating a crown-shaped capacitor includes providing a first dielectric layer with a protective pillar formed thereover, including a first conductive layer, a protective layer, and a mask layer. A second conductive layer is formed over a sidewall of the protective pillar. A first capacitance layer and a third conductive layer are formed over the first dielectric layer. A sacrificial layer is formed over the third conductive layer. The sacrificial layer, the third conductive layer, the first capacitance layer, the second conductive layer, and the mask layer above the protective layer are partially removed. The second conductive layer and the third conductive are removed to form a recess adjacent to the first capacitance layer. The protective layer is removed and an opening is formed to expose the first and second conductive layers. A second capacitance layer and a fourth conductive layer are formed in the opening. The sacrificial layer is removed to expose the third conductive layer.

18 Claims, 6 Drawing Sheets

METHOD FOR FABRICATING CROWN-SHAPED CAPACITOR

CROSS REFERENCE TO RELATED APPLICATIONS

This Application claims priority of Taiwan Patent Application No. 98145470, filed on Dec. 29, 2009, the entirety of which is incorporated by reference herein.

BACKGROUND OF THE INVENTION

1. Field of the Invention

The present invention relates to fabrication of semiconductor memory devices, in particular to a method of fabricating a crown-shaped capacitor for semiconductor memory devices.

2. Description of the Related Art

A dynamic random access memory (DRAM) device is a kind of a volatile memory device. Digital data storage in a DRAM device is executed by charges and discharges of a capacitor in the DRAM device. When power supplied to the DRAM device is turned off, the data stored in the memory cell of the DRAM device completely disappears. A memory cell in the DRAM device typically includes at least one field effect transistor (FET) and one capacitor. The capacitor is used for storing signals in the cells of the DRAM device. Commonly used capacitors today, are trench capacitors and crown-shaped capacitors.

With the size of DRAM device memory cells shrinking, the technological development to maintain the appropriate charge capacitance of capacitors has fallen behind that of the technological development to shrink memory cells. Namely, as the size of the capacitor in a memory cell is reduced, a predetermined charge capacitance is still required for reliable storage of signals.

Thus, methods for fabricating smaller capacitors, capable of maintaining or increasing storage capacitance, are desired.

BRIEF SUMMARY OF THE INVENTION

Methods for fabricating crown-shaped capacitors applicable in semiconductor memory devices, for example dynamic random access memory (DRAM) devices, are provided with improved capacitance and structural strength.

An exemplary method for fabricating a crown-shaped capacitor comprises providing a first dielectric layer with a conductive contact disposed therein. A protective pillar is formed over the first dielectric layer, wherein the protective pillar physically contacts the conductive contact and comprises a first conductive layer, a protective layer, and a mask layer sequentially disposed over the conductive contact. A second conductive layer is formed over a side of the protective pillar, wherein the second conductive layer physically contacts the first conductive layer, the protective layer and the mask layer. A first capacitance layer and a third conductive layer are conformably formed over the first dielectric layer to cover the conductive contact, the first dielectric layer, the second conductive layer, and the mask layer. A sacrificial layer is formed over the third conductive layer. The sacrificial layer, the third conductive layer, the first capacitance layer, the second conductive layer, and the mask layer above the protective layer are partially removed. The second conductive layer and the third conductive adjacent to the protective layer are removed to form a recess adjacent to the first capacitance layer. The protective layer is removed to form an opening, wherein the opening exposes the first conductive layer and a side surface of the second conductive layer not in contact with the first capacitance layer. A second capacitance layer and a fourth conductive layer are conformably formed in the opening, wherein the second capacitance layer fills the recess adjacent to the first capacitance layer and physically contacts the first capacitance layer. The sacrificial layer is removed to expose a sidewall surface of the third conductive layer not in contact with the first capacitance layer. A fifth conductive layer is formed to cover the fourth conductive layer, the second capacitance layer, and the third conductive layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Exemplary methods for fabricating a crown-shaped capacitor are described below with reference to FIGS. 1-11.

FIGS. 1-4 are cross sections of an exemplary method for fabricating a crown-shaped capacitor. Herein, the exemplary method is a method known by the inventors and is used as a comparative example to comment on the problems found by the inventors, but is not used to restrict the scope of the invention.

Figure 1:
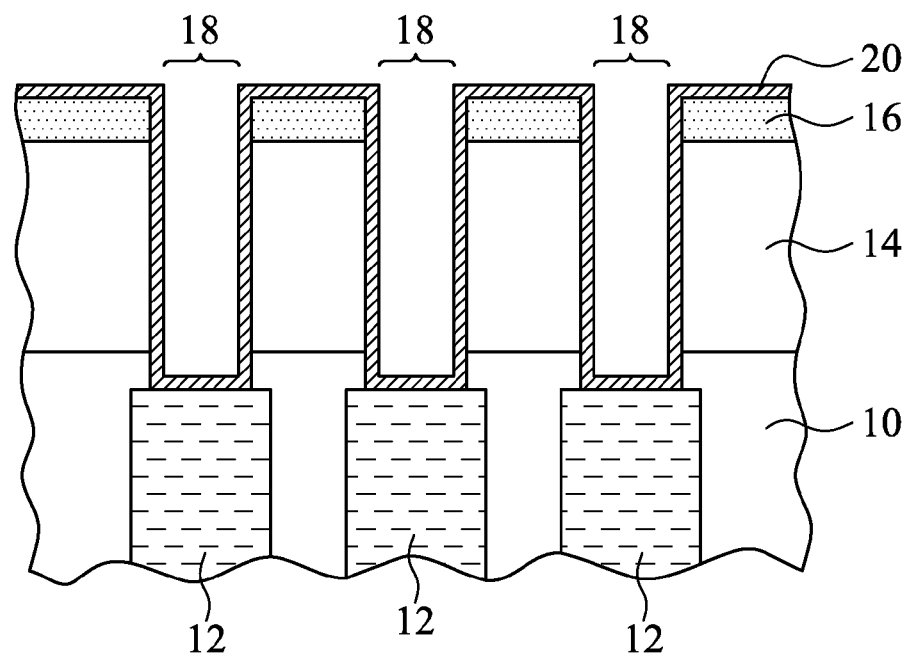
FIGS. 1-4 are cross sections showing a method for fabricating a crown-shaped capacitor according to an embodiment of the invention.

As shown in FIG. 1, a semiconductor structure is first provided, and the semiconductor structure may be located in a memory cell region (not shown) of a semiconductor memory device, such as a structure located in a memory cell region of a dynamic random access memory (DRAM) device. The semiconductor structure comprises a plurality of conductive contacts 12 embedded in a dielectric layer 10, and portions of the dielectric layer 10 above the conductive contacts 12 are removed to partially expose a top surface of each of the conductive contacts 12. Herein, the semiconductor structure may further comprise a substrate (not shown) and a plurality of transistors (not shown) formed on the semiconductor substrate, and the conductive contacts 12 respectively electrically contacts one of the transistors formed on the semiconductor substrate. For simplicity, the semiconductor structures are merely illustrated with the dielectric layer 10 and the conductive contacts 12 embedded therein, and the underlying semiconductor substrate and transistors which are known to those skilled in the art are omitted. Herein the dielectric layer 10 comprises materials such as updoped silicon glass (USG), phosphorus silicon glass (PSG), boron phosphorus silicon glass (BPSG), TEOS oxide, silicon nitride or insulating materials such as silicon oxide. The conductive contacts 12 comprise conductive materials such as doped polysilicon or metals such as tungsten. Next, a sacrificial layer 14 and a support layer 16 are blanketly formed over the dielectric layer to cover the dielectric layer 10 and the conductive contacts 12. The sacrificial layer 16 comprises materials such as polysilicon, updoped silicon glass (USG), phosphorus silicon glass (PSG), or boron phosphorus silicon glass (BPSG), TEOS oxide, silicon nitride or insulating materials such as silicon oxide, and preferably comprises polysilicon. A predetermined etching selectivity should be provided between the materials in the passivation layer 14 and the dielectric layer 10 to benefit subsequent processes. The support structure 16 comprises materials such as silicon nitride.

Referring to FIG. 1, photolithography and etching processes (both not shown) are performed to form a plurality of trenches 18 in the support layer 16 and the sacrificial layer 14. As shown in FIG. 1, the trenches 18 are aligned with one of the conductive contacts 12, respectively, and protrude downward and through the support layer 16 and the sacrificial layer 14, thereby exposing the conductive contacts 12 thereunder. Herein, the trenches 18 are pillar-like trenches and may have a circular or oval top view. After formation of the trenches 18, a first conductive layer 20 is conformably formed over the support layer 16 and the sacrificial layer 14. The first conductive layer 20 is also formed in each of the trenches 18 and covers the exposed surfaces of the support layer 16, the sacrificial layer 14, and the conductive contacts 12. The first conductive layer 20 comprises materials such as Ru, TaN, TiN, Pt, doped polysilicon or metal silicides, and can be formed by deposition processes such as chemical vapor deposition. Therefore, the first conductive layer 20 can be conformably formed over the surfaces of the support layer 16, the sacrificial layer 14, and the conductive contact 12.

Figure 2:
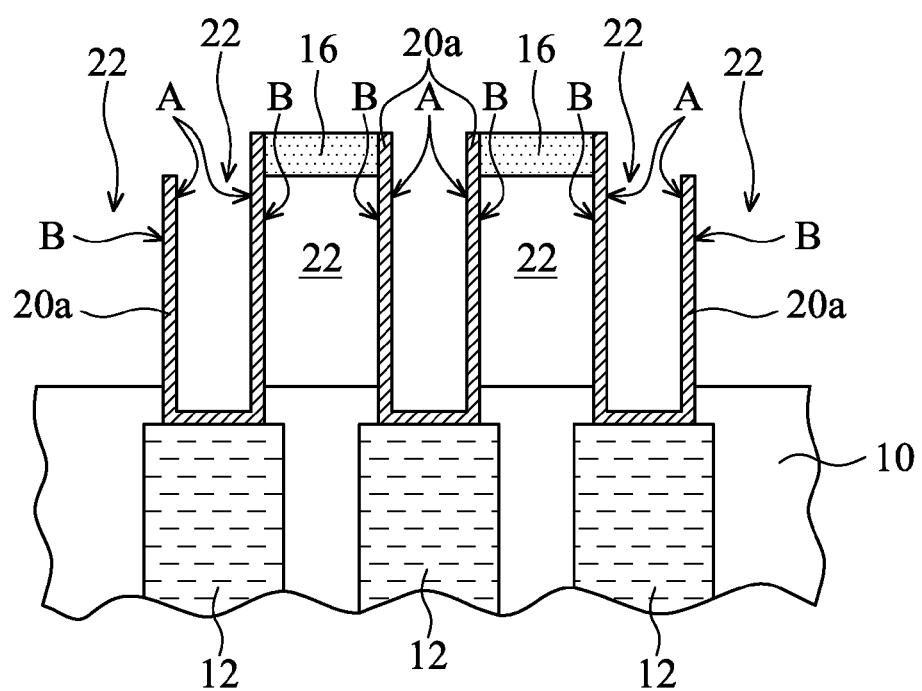

In FIG. 2, an etching process (not shown), for example a dry etching process, is then performed to remove portions of the first conductive layer 20 above the support layer 16 to expose the support layer 16. Next, another photolithography and etching process is performed to partially remove the support layer 16 by use of a mask having predetermined patterns thereon (not shown). Herein, taking the removal of the support layer 16 located at the most left side and the most right side thereof as an example, following, the sacrificial layer 14 under the support substrate 16 is exposed. Next, another etching process, for example a wet etching process, is performed to entirely remove the sacrificial layer 14 (shown in FIG. 1), thereby leaving a patterned first conductive layer 20a originally formed in the trenches 18 and the support layer 16 connected with the first conductive layers 20a over the dielectric layer 10 and the conductive contacts 12.

As shown in FIG. 2, at this time, a space 22 is formed between the first conductive layers 20a, and the conductive contact 12, the dielectric layer 10 and the support layer 16 adjacent thereto. The space 20 exposes opposite surfaces A and B of the first conductive layer 20a, wherein the surface A of the first conductive layer 20a is a surface originally located in the trench 18, and the surface B is a surface of the first conductive layer 20a originally contacting the sacrificial layer 14 (see FIG. 1).

Figure 3:
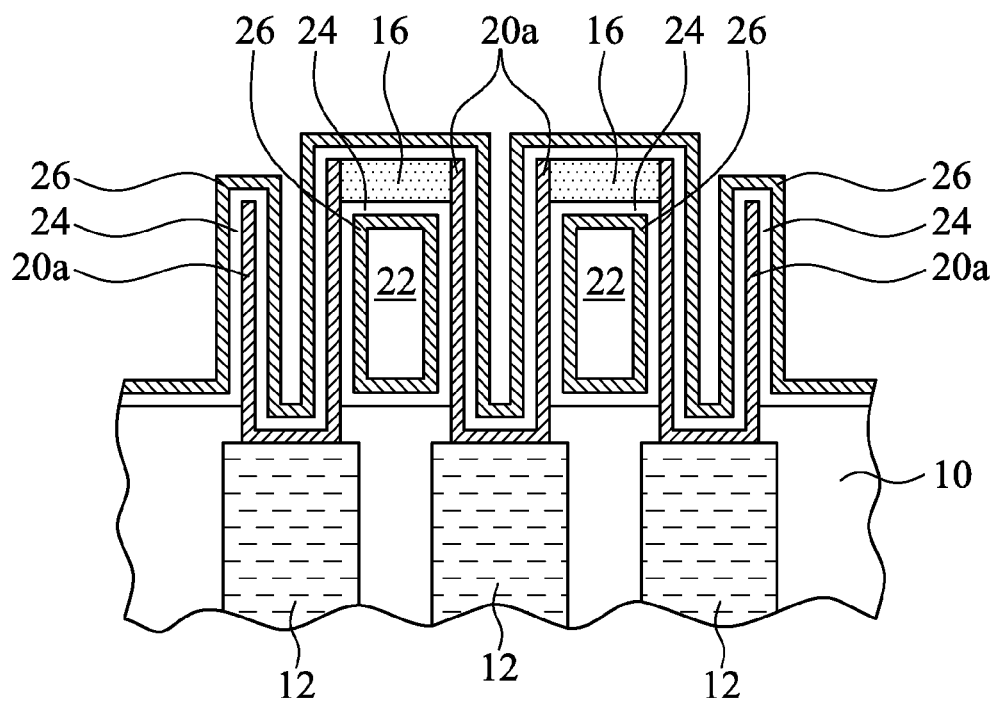

As shown in FIG. 3, a capacitance layer 24 and a second conductive layer 26 are sequentially and conformably formed on exposed surfaces of the first conductive layer 20a and the second conductive layer 26 exposed by each space 22. Herein, the capacitance layer 24 and the second conductive layer 26 are conformably formed on surface A and B of the first conductive layer 20a, but does not fill the space 22, respectively. The capacitance layer 24 comprises nitrogen-containing materials such as silicon nitride, or silicon oxynitride, or high-k dielectric materials (i.e. a dielectric material having a dielectric constant greater than the dielectric constant of the silicon nitride) such as $Al_2O_3$, $ZrO_2$, BST (BaSrTiO_3) or STO (SrTiO_3), BST, STO, $Ta_2O_5$, or $HfO_2$, and the second conductive layer 26 comprises materials such as Ru, TaN, TiN, Pt, doped polysilicon, or metal silicides. The capacitance layer 24 and the second conductive layer 26 may be formed by deposition processes such as chemical vapor deposition, to thereby conformably form the above mentioned film layers over the first conductive layer 20a and the support layer 16.

Figure 4:
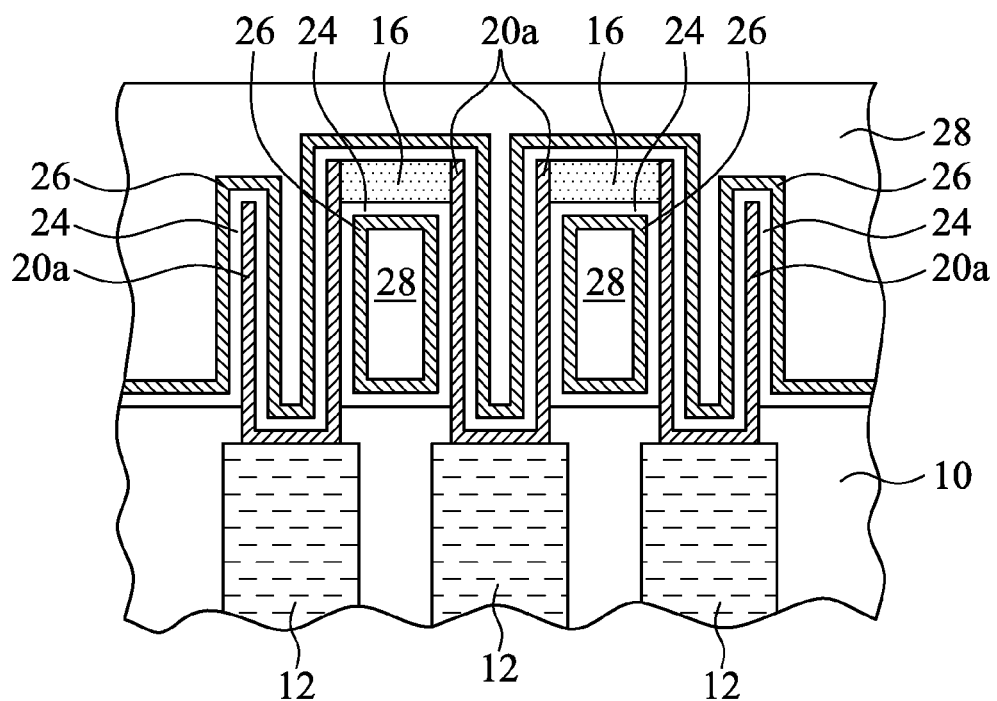

In FIG. 4, a layer of conductive material is blanketly formed over the structure shown in FIG. 3 to fill each of the spaces 22 and cover the second conductive layer 26. Next, a planarization process (not shown) is performed to planarize the above conductive materials and a third conductive layer 28 is formed above the structure shown in FIG. 3. The third conductive layer 28 fills each of the spaces 22 and the film structure thereof is a solid structure. Herein, the third conductive layer 28 comprises conductive materials such as Ru, TaN, TiN, Pt, doped polysilicon or metal silicides.

Accordingly, the description of fabricating an exemplary crown-shaped capacitor is substantially finished. The crown-shaped capacitor shown in FIG. 4 comprises the capacitance layer 24 formed on the opposite surfaces A and B of the first conductive layer 20a, and the second conductive layer 26, such that the fabricated crown-shaped capacitor may have increased capacitance and thereby is applicable in a crown-shaped capacitor with reduced size and a maintained or an increased capacitance level.

However, during the fabrication processes described in FIGS. 1-4, such as during the processes described in FIG. 2, the stereo structure composed of the patterned first conductive layer 20a and the support layer 16 is a hollow structure having a plurality of spaces 22 formed therebetween, and the hollow structure is supported by the dielectric layer 10, the first conductive layer 20a with a relatively thin thickness, and the support layer 16 with a relatively thicker thickness, thereby having poor mechanical strength. Thus, in the processes such as the wet etching process for removing the sacrificial layer 14 and/or the deposition processes for forming the capacitance layer 24 and the second conductive layer 26, the hollow structure may collapse due to the striking of process fluids used in the processes with ?, which ? in sequential process, thereby affecting process reliably and yield of the obtained crown-shaped capacitor shown in FIG. 4.

Therefore, due to the above process reliably issues in the method for fabricating the crown-shaped capacitor shown in FIGS. 1-4, an improved method for fabricating a crown-shaped capacitor is provided to fabricate a crown-shaped capacitor with increase capacitances and improved structure strength.

FIGS. 5-11 are cross sections showing another exemplary method for fabricating a crown-shaped capacitor of the invention.

Figure 5:
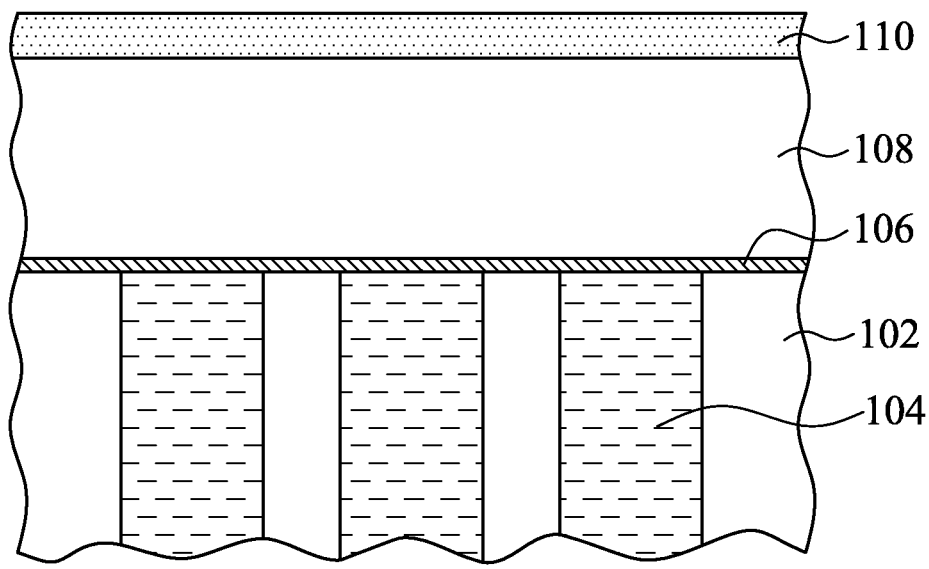
FIGS. 5-11 are cross sections showing a method for fabricating a crown-shaped capacitor according to another embodiment of the invention.

In FIG. 5, a semiconductor structure is first provided, and the semiconductor structure is located in a memory cell region (not shown) of a semiconductor memory device, such as a structure located in a memory cell region of a DRAM device. The semiconductor structure comprises a plurality of conductive contacts 104 disposed in a dielectric layer 102. Herein, the semiconductor structure may further comprise a substrate (not shown) and a plurality of transistors (not shown) formed on the semiconductor substrate, and the conductive contacts 104 respectively electrically contacts one of the transistors formed on the semiconductor substrate. For simplicity, the semiconductor structure is illustrated with the dielectric layer 102 and the conductive contacts 104 disposed therein, and the underlying semiconductor substrate and transistors which are known to those skilled in the art are omitted.

Herein, the dielectric layer 102 comprises materials such as updoped silicon glass (USG), phosphorus silicon glass (PSG), boron phosphorus silicon glass (BPSG), TEOS oxide, silicon nitride or insulating materials such as silicon oxide. The conductive contacts 104 comprise conductive materials such as doped polysilicon or metals such as tungsten. Next, a conductive layer 106, a protective layer 108 and a mask layer 110 are sequentially formed over the dielectric layer 102. The conductive layer 106 has a thickness of about 100-400 Å and comprises materials such as Ru, TiN, TaN, Pt, doped polysilicon, or metal silicides. The protective layer 108 has a thickness of about 10000-25000 Å, and comprise materials such as updoped silicon glass (USG), phosphorus silicon glass (PSG), boron phosphorus silicon glass (BPSG), TEOS oxide, silicon nitride or insulating materials such as silicon oxide, and preferably comprises polysilicon. A predetermined etching selectivity should be provided between the materials of the protective layer 108 and the underlying dielectric layer 102 to benefit subsequent processes, and the mask layer 110 comprise materials such as silicon nitride and has a thickness of about 8000-15000 Å.

Figure 6:
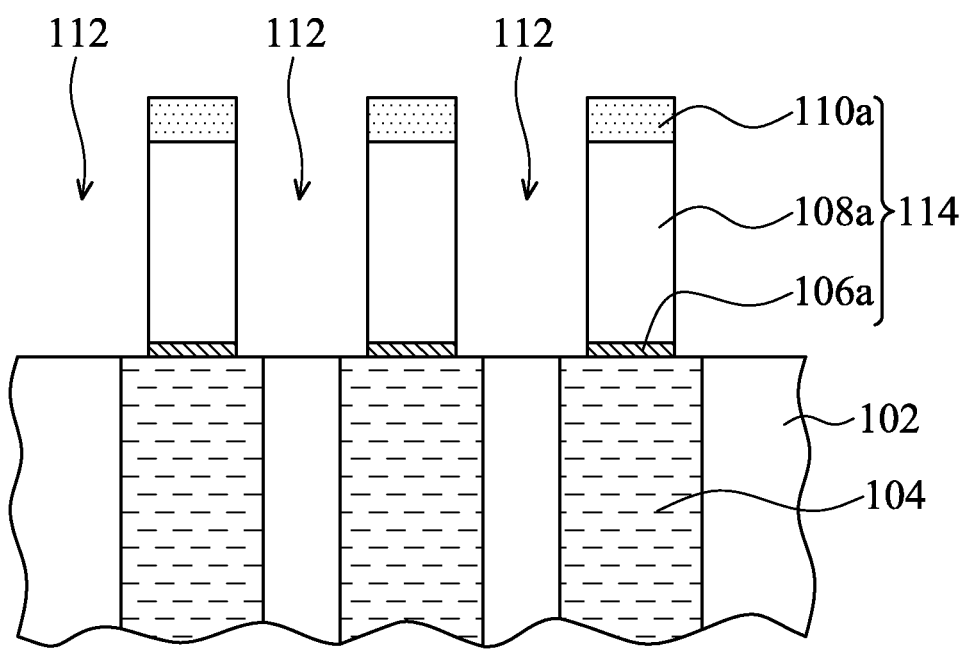

In FIG. 6, photolithography and etching processes (both not shown) are performed to pattern the conductive layer 106, the protective layer 108, and the mask layer 110 to form a plurality of protective pillars 114. Herein, the protective pillars 114 respectively align with one of the underlying conductive contacts 104. The protective pillars 104 may have a circular or oval top view. As shown in FIG. 6, each protective pillar 114 is formed by a patterned conductive layer 106a, a patterned protective layer 108a and a patterned mask layer 110a sequentially stacked over one of the conductive contacts 104, and the protective pillars 114 are separated from each other by a space 112 formed therebetween.

Figure 7:
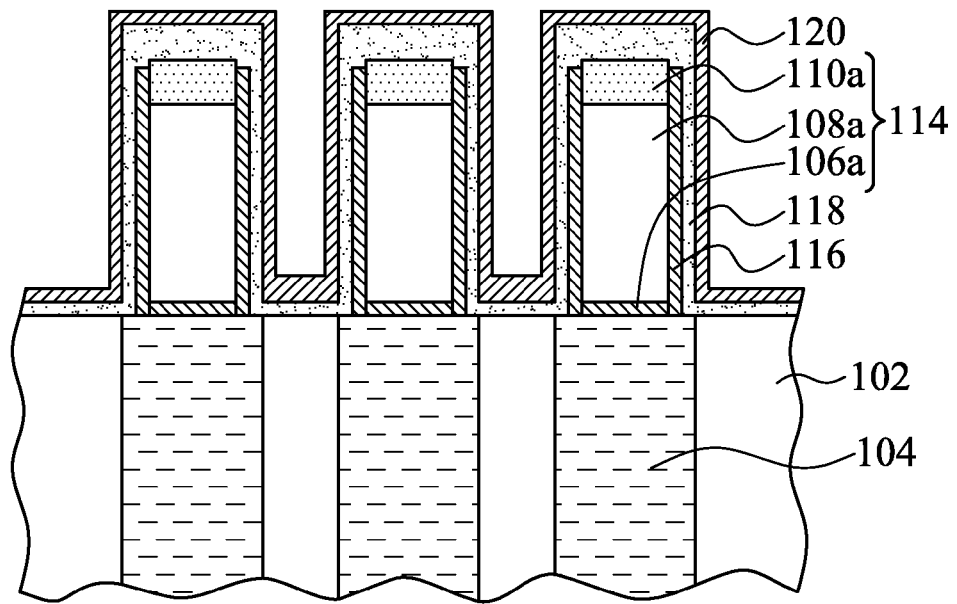

In FIG. 7, a layer of conductive material is conformably formed over the structure shown in FIG. 6, and an etching process (not shown) is then performed to form a conductive layer 116 on sidewalls of the protective pillars 114. The conductive layer 116 is formed over the conductive contacts 104 and physically contacts the conductive layer 106a, the protective layer 108a and the mask layer 110a in the protective pillar 114. After formation of the conductive layer 116, a capacitance layer 118 and a conductive layer 120 are sequentially formed over the dielectric layer 102. Herein, the capacitance layer 118 and the conductive layer 120 are sequentially formed over surfaces of the conductive layer 116, the mask layer 110a, the conductive contact 104 and the dielectric layer 102, but does not fill the spaces 112 (see FIG. 6). The capacitance layer 118 comprises nitrogen-containing materials such as silicon nitride, silicon oxynitride or high-k dielectric materials (i.e. a dielectric material having a dielectric constant greater than the dielectric constant of the silicon nitride) such as $Al_2O_3$, $ZrO_2$, BST, STO, $Ta_2O_5$, or $HfO_2$. The capacitance layer 118 and the conductive layer 120 have a thickness of about 50-130 Å and 30-100 Å, respectively, and can be formed by deposition processes such as chemical vapor deposition or atomic layer deposition.

Figure 8:
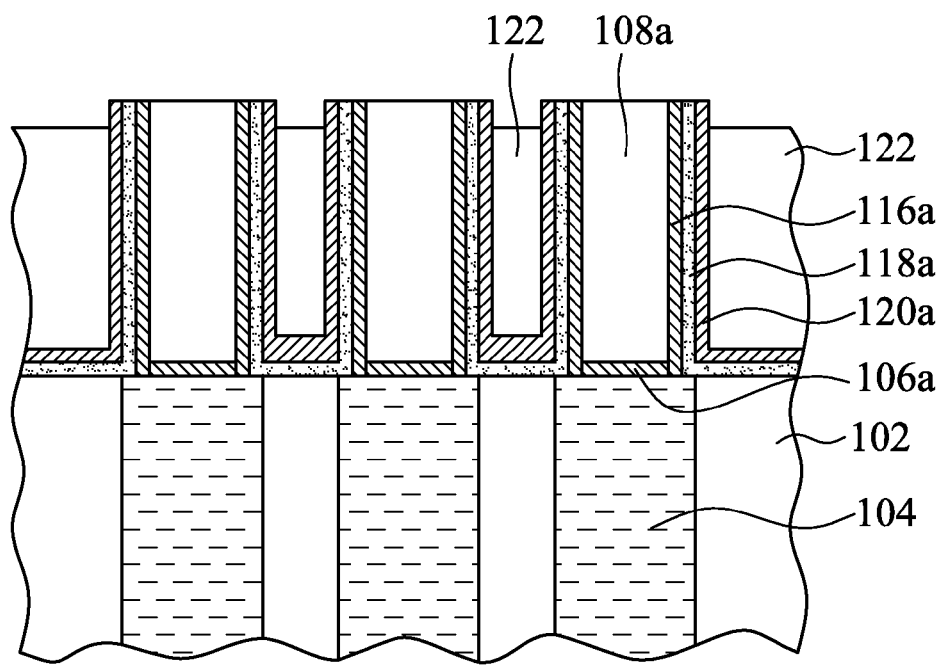

In FIG. 8, an insulating material is blanketly formed over the structure shown in FIG. 7 to cover the conductive layer 120 and fill the spaces between the conductive layer 120. Next, a planarization process (not shown) is performed to planarize the insulating materials and to remove materials of the conductive layer 120 and the capacitance layer 118 above a surface of the mask layer 110a of the protective pillars 114. Next, an etching process (not shown) is performed to remove the mask layer 110a in each of the protective pillars 114, thereby exposing the protective layer 108a in the protective pillars 114. For the etching process, a dry or wet etching process can be used such that portions of the insulating materials, the conductive layer 120, the capacitance layer 118 and the conductive layer 116 adjacent to the mask layer 110a are also removed during removal of the mask layer 110a, thereby partially etched conductive layers 116a and 120a, and partially etched capacitance layer 118a and the sacrificial layer 122 are formed over the dielectric layer 102. Herein, after the etching process is performed, a surface of the sacrificial layer 122 is slightly below the surfaces of the above film layers.

Figure 9:
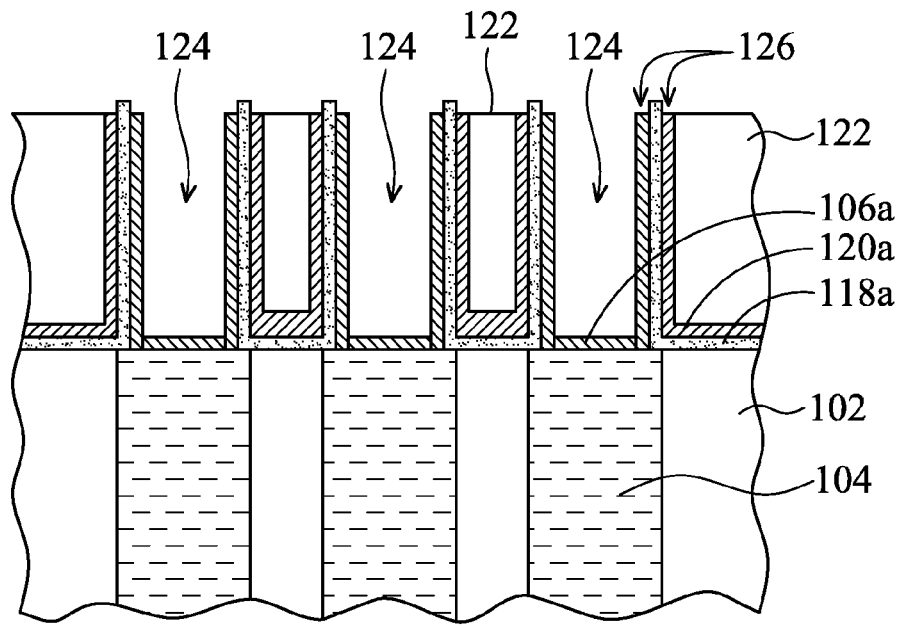

In FIG. 9, an etching process (not shown), for example a wet etching process, is performed, to remove portions of the conductive layers 116a and 120a adjacent to both sides of the capacitance layer 118a, thereby forming recesses 126 between the protective layer 108a, the capacitance layer 118a and the sacrificial layer 122. Next, another etching process (not shown), for example a dry or wet etching process, is performed to remove the protective layer 108a and form openings 124. The openings 124 expose the conductive layer 106a under the protective layer 108a and the conductive layer 116a at a side thereof.

Figure 10:
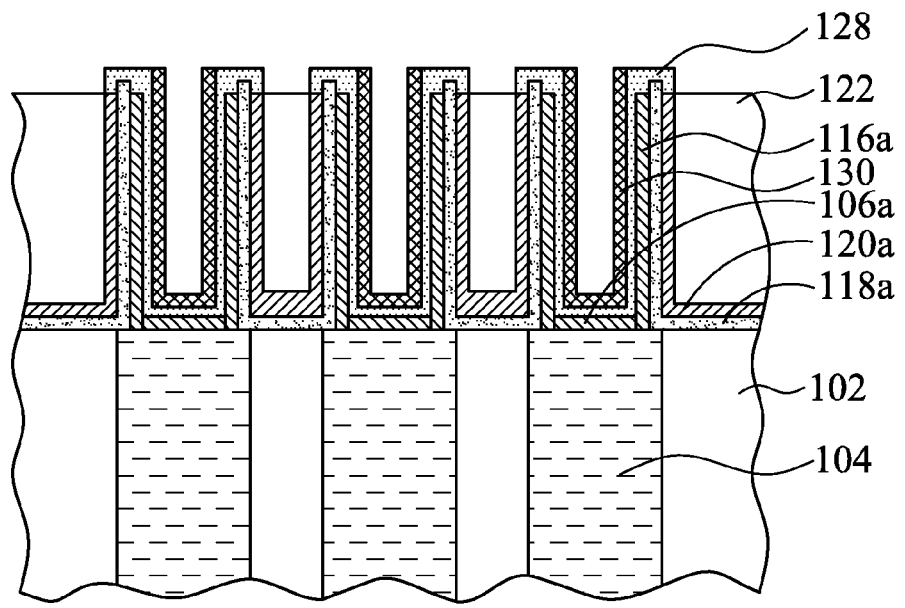

In FIG. 10, a layer of capacitance material and a layer of conductive material are conformably formed over the structure shown in FIG. 9. Next, an etching process (not shown), for example a dry etching process, is performed to respectively form a capacitance layer 128 and a conductive layer 130 over the conductive layer 120a and the capacitance layer 118a. The capacitance layer 128 back fills the recesses 126 formed between the protective layer 108a, the capacitance layer 118a and the sacrificial layer 122 and forms in the openings 124, thereby physically contacting the capacitance layer 118a between the conductive layer 116a and 120a, and the conductive layer 106a and 116a in the openings 124. Herein, the capacitance layer 128 comprises nitrogen-containing dielectrics such as silicon nitride, oxynitride, or high-k dielectric materials such as $Al_2O_3$, $ZrO_2$, BST, STO, $Ta_2O_5$, or $HfO_2$, and the conductive layer 130 comprises conductive materials such as Ru, TaN, TiN, Pt, doped polysilicon or metal silicides. The capacitance layer 128 and the conductive layer 130 have a thickness of about 50-130 Å and 30-100 Å, respectively, and can be formed by deposition processes such as chemical vapor deposition or atomic layer deposition.

Figure 11:
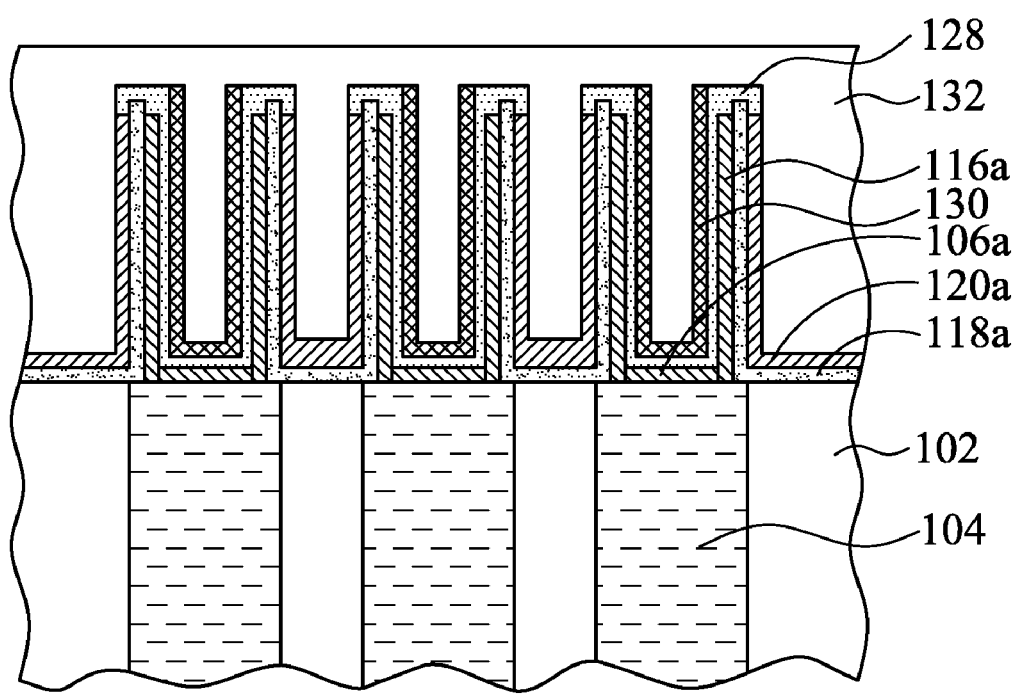

In FIG. 11, an etching process (not shown), for example a wet etching process, is performed to remove the sacrificial layer 122 and expose the conductive layer 120a. After removal of the sacrificial layer 122, a conductive material is blanketly formed over the conductive layer 120a, the conductive layer 130, and the capacitance layer 128. Next, a planarization process (not shown) is performed to planarize the above conductive materials, thereby forming a planar conductive layer 132. The conductive layer 132 comprises conductive materials such as Ru, TaN, TiN, Pt, doped polysilicon or metal silicides.

Accordingly, another description of fabricating an exemplary crown-shaped capacitor is substantially finished. The crown-shaped capacitor shown in FIG. 11 mainly comprises a bottom electrode composed of a conductive layer 106a and two conductive layers 116a disposed over the conductive contacts 104, two independent top electrodes made of the conductive layers 120a and 130, and a capacitance layer made of the capacitance layers 116a and 128 formed on the bottom electrode from both side surfaces thereof and between the conductive layers 120a and 130a. Thus, the fabricated crown-shaped capacitor may have increased capacitance and is applicable in crown-shaped capacitors with reduced sizes, while maintaining or increasing capacitance levels thereof.

Moreover, through the processes illustrated in FIGS. 5-11, and described above, due to formation of the protective pillars 114 and the sacrificial layer 122, the conductive layers 116a and 106a for the bottom electrode, the conductive layers 130 and 122a for the top electrode, and the capacitances 116a and 128 for the capacitance layer are all structurally supported by the protective pillar 114 and the sacrificial layer 122 during fabrication thereof. Thus, the main film layers composing the crown-shaped capacitor will not be formed with a hollow structure as that illustrated in the process shown in FIGS. 1-4, such that the main film layers for composing the crown-shaped capacitor shown in FIG. 11 will not be affected by process fluids in etching processes and in deposition processes and by particles formed in sequential processes, thereby ensuring process reliably and yield of the crown-shaped capacitor shown in FIG. 11.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a crown-shaped capacitor, comprising:
   providing a first dielectric layer with a conductive contact disposed therein;
   forming a protective pillar over the first dielectric layer, wherein the protective pillar physically contacts the conductive contact and comprises a first conductive layer, a protective layer, and a mask layer sequentially disposed over the conductive contact;
   forming a second conductive layer over a side of the protective pillar, wherein the second conductive layer physically contacts the first conductive layer, the protective layer and the mask layer;
   conformably forming a first capacitance layer and a third conductive layer over the first dielectric layer to cover the conductive contact, the first dielectric layer, the second conductive layer, and the mask layer;
   forming a sacrificial layer over the third conductive layer;
   partially removing the sacrificial layer, the third conductive layer, the first capacitance layer, the second conductive layer, and the mask layer above the protective layer;
   removing the second conductive layer and the third conductive adjacent to the protective layer, forming a recess adjacent to the first capacitance layer;
   removing the protective layer and forming an opening, wherein the opening exposes the first conductive layer and a side surface of the second conductive layer not in contact with the first capacitance layer;
   conformably forming a second capacitance layer and a fourth conductive layer in the opening, wherein the second capacitance layer fills the recess adjacent to the first capacitance layer and physically contacts the first capacitance layer;
   removing the sacrificial layer and exposing a sidewall surface of the third conductive layer not in contact with the first capacitance layer; and
   forming a fifth conductive layer to cover the fourth conductive layer, the second capacitance layer, and the third conductive layer.

2. The method as claimed in claim 1, wherein the first and second conductive layers form a bottom electrode.

3. The method as claimed in claim 1, wherein the first and second capacitance layers form a capacitance layer.

4. The method as claimed in claim 1, wherein the third and fourth conductive layers respectively form a top electrode.

5. The method as claimed in claim 1, wherein the protective pillar merely partially covers the conductive contact, thereby partially exposing a top surface of the conductive contact, and the second conductive layer physically contacts the top surface of the conductive contact and the first conductive layer.

6. The method as claimed in claim 1, wherein partially removing the sacrificial layer, the third conductive, the first capacitance layer, the conductive layer, and the mask layer above the protective layer, comprises:
   performing a planarization process to remove the sacrificial layer, the third conductive, the first capacitance layer, and the second conductive layer above the mask layer; and
   performing an etching process to remove the mask layer and the sacrificial layer, the third conductive, the first capacitance layer, and the second conductive layer above the protective layer.

7. The method as claimed in claim 1, wherein removing the protective layer comprises performing a wet etching process.

8. The method as claimed in claim 1, wherein removing the sacrificial layer comprises performing a wet etching process.

9. The method as claimed in claim 1, wherein removing the second conductive layer and the third conductive adjacent to the protective layer and forming a recess adjacent to the first capacitance layer, comprises performing a dry etching process.

10. The method as claimed in claim 1, wherein the second and third conductive layers are disposed over opposite surfaces of the first capacitance layer.

11. The method as claimed in claim 1, wherein the second and fourth conductive layers are disposed over opposite surfaces of the second capacitance layer.

12. The method as claimed in claim 1, wherein the first and second capacitance layers comprise nitrogen containing dielectric materials or high-k dielectric materials.

13. The method as claimed in claim 1, wherein the first, second, third, fourth, and fifth conductive layers comprise Ru, TaN, TiN, Pt, doped polysilicon or metal silicides.

14. The method as claimed in claim 1, wherein the protective layer, the sacrificial layer, and the first dielectric layer comprise materials of a high etching selectivity therebetween.

15. The method as claimed in claim 1, wherein the protective pillar has a circular or oval top view.

16. The method as claimed in claim 1, wherein the mask layer comprises silicon nitride.

17. The method as claimed in claim 1, wherein the second dielectric layer comprises polysilicon, undoped silicon glass, BSG, BPSG, TEOS oxide, silicon nitride, or silicon dioxide.

18. The method as claimed in claim 1, wherein the conductive contact comprises doped polysilicon or tungsten.

* * * * *